United States Patent

Okumura et al.

Patent Number: 5,448,416
Date of Patent: Sep. 5, 1995

[54] WIDE-FIELD EXPOSURE OPTICAL SYSTEM

[75] Inventors: Toshiki Okumura, Tokyo; Hisakazu Yoshino, Tochigi; Takuji Satoh, Tokyo, all of Japan

[73] Assignee: Kabushiki Kaisha Topcon, Tokyo, Japan

[21] Appl. No.: 25,340

[22] Filed: Mar. 3, 1993

[30] Foreign Application Priority Data

Mar. 4, 1992 [JP] Japan ................. 4-047342

[51] Int. Cl.⁶ ............................ G02B 17/00
[52] U.S. Cl. ................... 359/727; 359/736
[58] Field of Search ............... 359/726–732, 359/201, 733–736

[56] References Cited

U.S. PATENT DOCUMENTS 3,748,015  7/1973  Offner ................. 359/731
4,711,535 12/1987  Shafer ................. 359/731

FOREIGN PATENT DOCUMENTS 45-6999  3/1970  Japan.

OTHER PUBLICATIONS

Suzuki, A., "Complete Analysis of a Two-Mirror Unit Magnification System. Parts 1 and 2", *Applied Optics*, vold. 22, No. 24, Dec. 15, 1983, pp. 3943–3956.

*Primary Examiner*—Loha Ben
*Assistant Examiner*—James Phan
*Attorney, Agent, or Firm*—Popham, Haik, Schnobrich & Kaufman, Ltd.

[57] ABSTRACT

A wide-field exposure optical system in which the projection is performed by scanning an object to be projected with a predetermined scan width. The optical system comprises an illuminating section for illuminating the object to be projected in a circular arc region, a reflecting and refracting optical system for correcting the aberration of a circular arc region having its center on the optical axis and for forming, within an image surface, an image of the object to be projected illuminated by the illuminating section as a circular arc, a driving means for moving light-receiving members arranged on the object to be projected and on the image surface relative to the illuminating section and the reflecting and refracting optical system, and the reflecting and refracting optical system being formed by a first lens group, a second lens group and one concave mirror. The second lens group comprises a second lens which is a convex lens and a third lens which is a concave lens.

2 Claims, 3 Drawing Sheets

WIDE-FIELD EXPOSURE OPTICAL SYSTEM

BACKGROUND OF THE INVENTION

1. Field of the invention

The present invention relates to a wide-field exposure optical system which can perform a wide-field and high resolution projection.

2. Description of Background Art

There has been known as a high resolution projection apparatus in the prior art a stepper which has a lens optical system and sequentially projects onto subdivided light-receiving objects and then exposes them. Such a stepper can perform the scaling (i.e. minification and enlargement) and also can increase the numerical aperture (NA).

However when trying to obtain the wide-field the magnification of projection becomes 1 (one) and the abaxial aberration is caused. It is difficult to correct these problems and therefore it is difficult, for example, to obtain a field more than $15 \times 15$ cm$^2$.

It is also known other high resolution projection apparatus of the prior art such as disclosed in Japanese Patent Publication No. 51083/1982. This projection apparatus is a scanning type apparatus in which a concave mirror 100 and a convex mirror 102 are oppositely arranged as shown in FIG. 5.

In this optical system, an object to be projected and an imaging position are arranged at a symmetric position centered on an optical axis 104 and an aberration corrected region 106 is formed in an annular region centered on the optical axis 104. The luminous flux used in projection is only a luminous flux which transmits through the aberration corrected region limited by a mask (not shown) arranged near both the object to be projected and the imagery position. The scanning is performed by moving the object to be projected and a photosensitive material arranged at the imaging position with synchronizing them with each other along arrows shown.

SUMMARY OF THE INVENTION

The optical system of the scanning type projection apparatus having a wide-field becomes large even though it is a lens optical system or a reflecting optical system having a mirror. The accuracy of the projection apparatus is inevitably lowered due to the heavy self-weight of the large optical members and their holding means.

When the maximum value of the distortion of optical members is "Pv", the influences of the aberration brought by Pv are expressed as follows:

$2 \times Pv$; the distortion of the reflecting surface of the cataptric system and, $(n-1) \times Pv$; the distortion of the refracting surface of the reflecting optical system, wherein "n" is a refractive index of lens in the lens optical system. Since the value "n" is "1.5" in general, the value $(n-1) \times Pv$ of the reflecting optical system is expressed as $(0.5 \times Pv)$. Accordingly if trying to make influences to the aberration due to the distortion of optical members between the refracting optical system having lenses and the reflecting optical system identical, the machining and holding accuracy of the reflecting surface must be as high as 4 times that of the refracting surface. From this reason, it is considered that the reflecting optical system is more preferable than the lens optical system for the scanning type projection apparatus having a wide-field.

In addition when using the scanning type projection apparatus having a wide-field as a exposure apparatus for the LCD (liquid crystal display), the mask used is expensive in manufacturing cost and therefore small mask is preferable.

Furthermore it is preferable to make the numerical aperture (NA) large in consideration of the resolution of the optical system of the scanning type projection apparatus. However in the optical system of the prior art shown in FIG. 5, it is impossible to make the NA large because the luminous flux transmitting through around the convex mirror 102 interferes with the luminous flux admitting to and reflected by the convex mirror 102.

According to the present invention there is provided a wide-field exposure optical system which can solve the problems of the prior art apparatus in which the projection is performed by scanning an object to be projected with a predetermined scan width comprising an illuminating section 10 for illuminating the object to be projected in a circular arc region, a reflecting and refracting optical system having at least a lens and a mirror for correcting the aberration of a circular arc region having its center on the optical axis 20 and for forming, within an image surface, an image of the object to be projected illuminated by the illuminating section 10 as a circular arc, a driving means 30 for moving light-receiving members 40 arranged on the object to be projected and on the image surface relative to the illuminating section 10 and the reflecting and refracting optical system, as indicated by the arrows in FIG. 1, and said reflecting and refracting optical system being formed by a first lens group, a second lens group and one concave mirror.

BRIEF DESCRIPTION OF THE DRAWINGS

The present invention will now be described by way of examples, with reference to the accompanying drawings, in which.

DESCRIPTION OF THE PREFERRED EMBODIMENT

Figure 1:
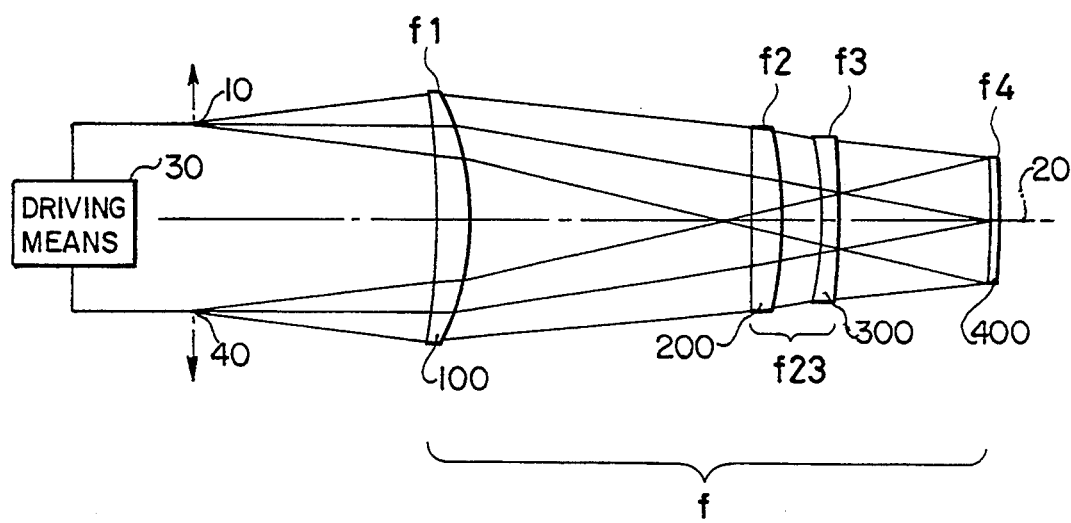
FIG. 1 is an optical drawing showing one embodiment of a wide-field exposure optical system of the present invention.

As shown in FIG. 1, the reflecting and refracting optical system projection apparatus of the present invention has an optical system which comprises a 4 (four) group optical system including a cata-dioptric system of 3 (three) lenses and one concave mirror and which forms a symmetric bi-telecentric system in which the position of the concave mirror corresponds to the pupil position. An object to be projected is illuminated in its circular arc region having its center on the optical axis 20 and at its imaging position, only a circular arc region having its center substantially on the optical axis 20 is used as a luminus flux for projection.

Then the optical structure will be explained sequentially from the side near the image of the object. First of all, a first lens group 100 is a lens group for making the luminous flux telecentric. This first lens group 100 is not required if the telecentric condition is not necessary. Second and third lenses 200 and 300 are those respectively for correcting the spherical aberration and the chromatic aberration and are formed by lens groups having a convex power and a concave power. A final optical group acts to reduce the Petzval sum and is formed by a concave mirror 400. The best solution for aberration can be obtained if the following conditions are satisfied:

$$0.2 < |f1/f| < 0.5 \quad (1)$$

$$10 < |f23/f| < 50 \quad (2)$$

$$0.1 < |f4/f| < 0.4 \quad (3)$$

wherein, "f" is a focal length of the whole optical system,

"f 1" is a focal length of the first lens group 100,

"f23" is a focal length of the second and third lenses 200 and 300, which define a second lens group, "f 3" is a focal length of the third lens 300, and "f 4" is a focal length of the final concave mirror.

In a following embodiment in which the second lens groups is formed by convex-meniscus and concave-meniscus lenses, the best solution for aberration can be obtained if a following condition is satisfied:

$$|f2| \approx |f3| \quad (4)$$

wherein, "f 2" is a focal length of the second lens 200 and,

"f 3" is a focal length of the third lens 300.

When the equation (1) cannot be satisfied, a state exists in which telecentric condition is not satisfied. In an optical system which does not require a strict telecentric condition, a power arrangement can be obtained by making an exception of the equation (1).

The equation (3) is a condition for reducing the Petzval sum and therefore the region having a superior image is reduced if the solution cannot satisfy the condition of the equation (3). In the exposure optical system to which the present invention is applied, it is required that only a certain abaxial region should have the flatness of image surface as large as possible and is not required to have the flatness of image surface throughout a region from the optical axis to the abaxial region.

In applying the equation (2), particularly in a case that the second lens is formed by convex-meniscus lenses and the third lens is formed by concave-meniscus lenses, it is preferable to make the absolute values of the focal lengths of the convex and concave lenses nearly the same as shown in the equation (4). When this condition could not be satisfied, the spherical aberration and the chromatic aberration would be caused.

Then an embodiment satisfying the equations (1) through (4) will be described in which the wavelength is a g-line; magnification is one time (×1) NA (0.12); and the radius of the circular arc is 220 mm.

| | | |
|---|---|---|
| f = −5043.2 mm | | |
| r 1 = −4013.12 | d 1 = 90 | n 1 = 1.526214 |
| r 2 = −665.922 | d 2 = 700 | |
| r 3 = −14455.47 | d 3 = 70 | n 2 = 1.729443 |

-continued

| | | |
|---|---|---|
| r 4 = −1406.74 | d 4 = 100 | |
| r 5 = −895.39 | d 5 = 40 | n 3 = 1.599644 |
| r 6 = −3079.84 | d 6 = 380 | |
| r 7 = −2365.56 | | | wherein r 1~r 7 : radius of curvature (mm), d 1~d 6 : lens thickness or lens distance (mm) and, n 1~n 3 : refractive index of lens at the g-line.

Figure 2:
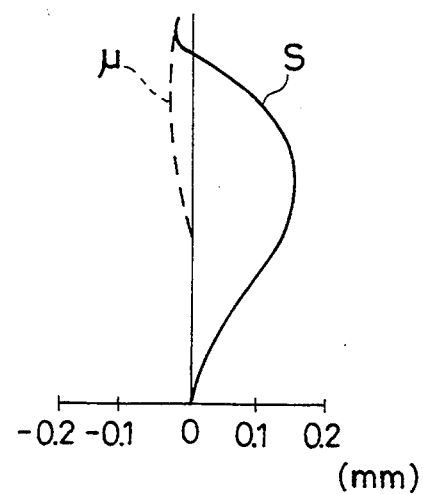
FIG. 2 is a drawing showing the aberration of the embodiment of FIG. 1.
Figure 3:
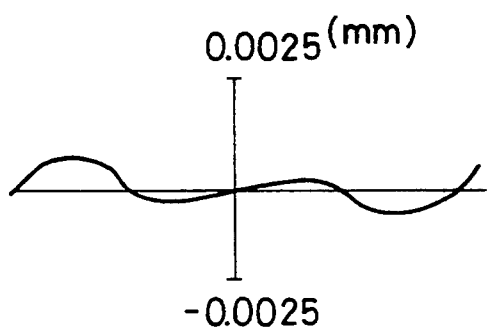
FIG. 3 is another drawing showing the aberration of the embodiment of FIG. 1.
Figure 4:
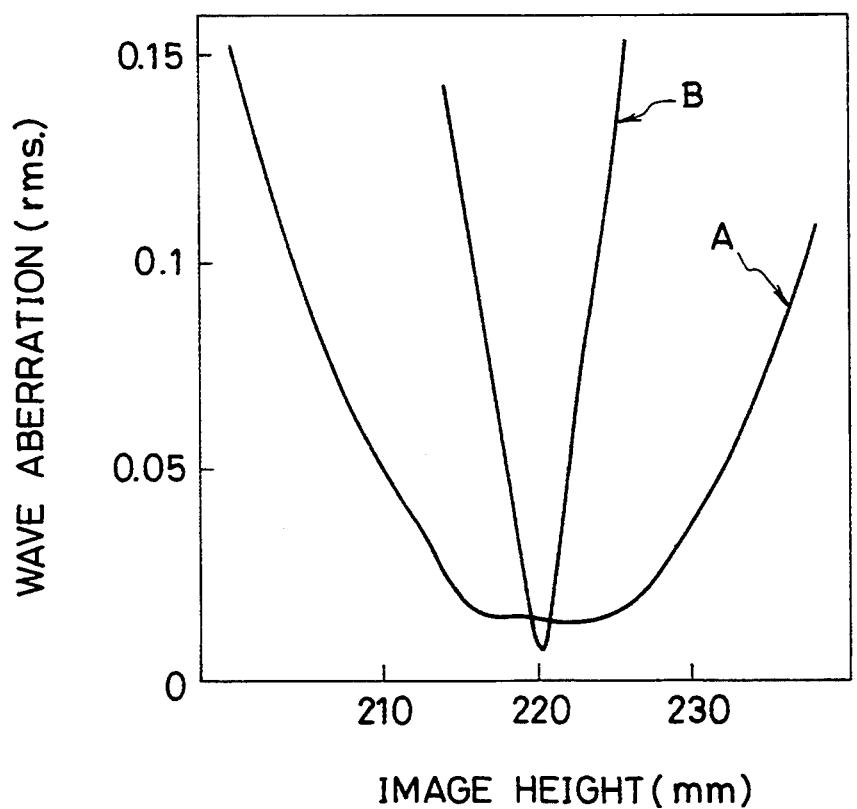
FIG. 4 is a drawing showing the wavefront aberration of the embodiment of FIG. 1 compared with that of the field exposure optical system of the prior art.
Figure 5:
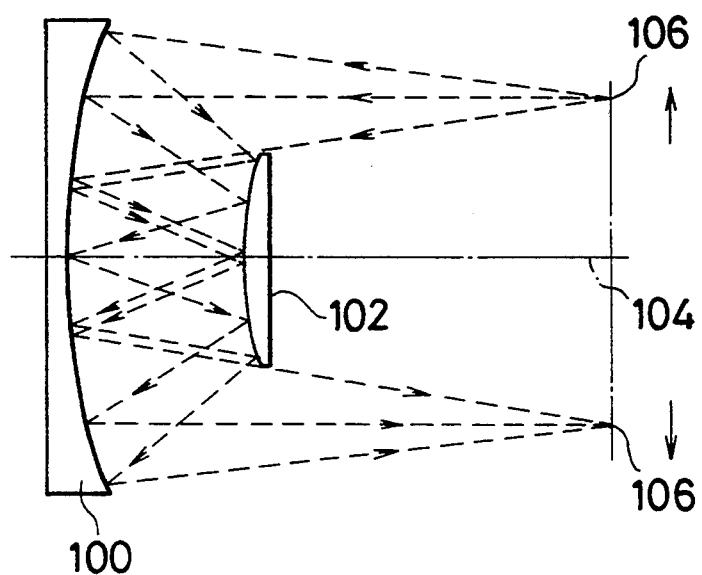
FIG. 5 is an optical drawing showing the reflection type scan projection apparatus of the prior art.

The aberration diagrams of this embodiment are shown in FIGS. 2 and 3. In FIG. 4, a curve "A" shows a relation between an amount of the wavefront aberration on the ordinate (RMS) and a circular arc width on the abscissa, and a curve "B" similarly an amount of the wavefront aberration of the prior art (the cataptric system). The apparatus herein used is that having two mirrors as shown in FIG. 5 and a concave mirror having the radius of curvature of 2000 mm. This is because this apparatus has a whole length the same as that of the apparatus of the present invention. It can be appreciated from FIG. 4 that the present invention can provide a wide superior image region. With the use of the apparatus of the prior art, it is necessary to use a large concave mirror having a radius of curvature of about 3000 through 4000 mm in order to obtain an image region which has superior quality the same as that obtained by the present invention and therefore a large space is required, from which it will be also appreciated that the wide-field exposure optical system provided by the present invention is very compact.

According to the present invention the optical system included in the scanning type projection apparatus is the refracting system and not the reflecting optical system and has an advantage that it has a high projection accuracy even though the accuracies in machining and holding the refracting surface are kept low. In addition since the magnification of projection can be easily incressed more than 1 (one), it is possible to reduce the size of the mask of the illumination section which requires a high manufacturing cost. Furthermore it is possible according to the present invention to improve the resolution of the optical system of the scanning type projection apparatus.

What is claimed is:

1. A wide-field exposure optical system in which projection is performed by scanning an object to be projected with a predetermined scan width, said system comprising:

an illuminating section for illuminating the object to be projected in a circular arc region having its center on an optical axis;

a reflecting and refracting optical system for correcting the aberration of the circular arc region and for forming, within an image surface, an image of the object to be projected illuminated as a circular arc by said illuminating section, said reflecting and refracting optical system having a focal length "f" and comprising a first lens group having a focal length "f 1" second and third lenses defining a second lens group having a focal length "f23" and a final concave mirror having a focal length "f 4" and said reflecting and refracting optical system satisfying the following equations:

$$0.2 < |f1/f| < 0.5$$

$$10 < |f23/f| < 50$$

$0.1 < |f4/f| < 0.4$; and driving means for moving light-receiving members arranged on the object to be projected and on the image surface relative to said illuminating section and said reflecting and refracting optical system.

2. The wide-field exposure optical system as claimed in claim 1, wherein said second lens is a convex-meniscus lens having a focal length "f 2" said third lens is a concave-meniscus lens having a focal length "f 3" and the following equation is satisfied:

$|f2| = |f3|$.

* * * * *